United States Patent [19]
Alexander

[11] Patent Number: 5,513,334
[45] Date of Patent: Apr. 30, 1996

[54] MEMORY DEVICE WITH SWITCHING OF DATA STREAM MODES

[75] Inventor: Samuel E. Alexander, Phoenix, Ariz.

[73] Assignee: Microchip Technologies, Inc., Chandler, Ariz.

[21] Appl. No.: 266,948

[22] Filed: Jun. 27, 1994

[51] Int. Cl.[6] .............................. G06F 12/00; G06F 1/10
[52] U.S. Cl. .................. 395/430; 364/254.8; 364/270.3; 364/954.2; 364/238; 364/DIG. 1
[58] Field of Search ..................................... 395/425, 800, 395/430; 365/189.03, 189.02

[56] References Cited

U.S. PATENT DOCUMENTS

| | | | |
|---|---|---|---|
| 4,713,756 | 12/1987 | Mackiewicz | 365/228 |
| 4,841,485 | 6/1989 | Prilik | 365/189.03 |
| 4,855,994 | 8/1989 | Takeuchi | 370/69.1 |
| 4,962,485 | 10/1990 | Kato | 365/229 |
| 5,053,990 | 10/1991 | Kreifels | 365/218 |
| 5,070,500 | 12/1991 | Horinouchi | 370/69.1 |

Primary Examiner—Eric Coleman
Attorney, Agent, or Firm—Wigman, Cohen, Leitner & Myers

[57] ABSTRACT

An $I^2C$ bus-compatible, serial EEPROM device is used in applications involving storage and serial transmission of configuration and control information for an intelligent peripheral device with which the EEPROM device is associated, for communication on a bus to a host device adapted to control the peripheral device. The EEPROM device has a memory array for storing data representing the configuration and control information. Two modes of data transmission are supported by the EEPROM device, and are alternately and selectively established according to whether data stored in the EEPROM array is to be read only, by sequential output onto the bus, or the array is also to be allowed to be written to. The arrangement ultimately allows intelligent interaction between the host device and the peripheral device. A separate clock line supplements the usual clock line and data line of an $I^2C$ bus to support the distinct and different modes, with clocking by the respective clock line for the established mode. A controlled multiplexer selectively connects the input clock according to a predetermined logic level transition on one of the two clock lines.

16 Claims, 3 Drawing Sheets

DATA TRANSFER SEQUENCE ON SERIAL BUS:
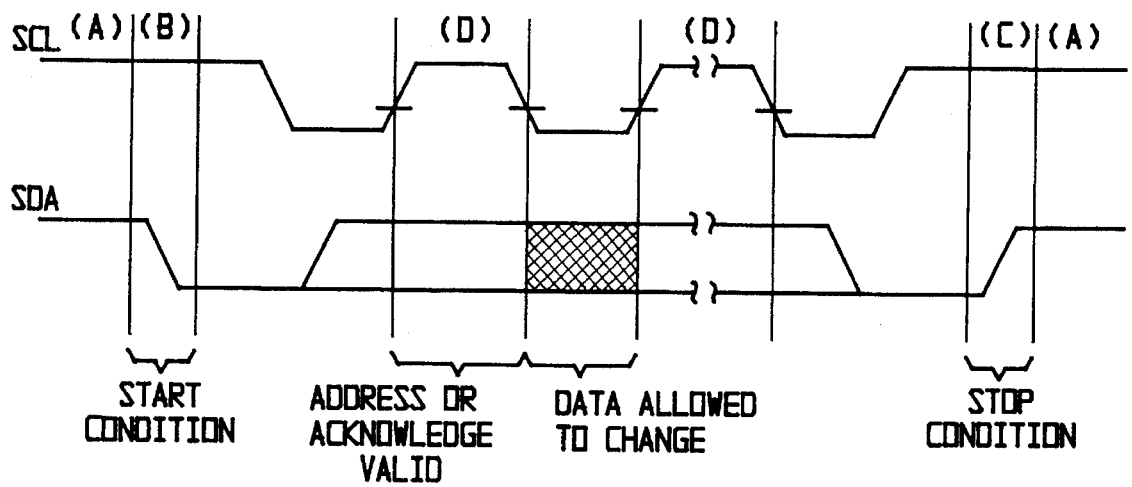
FIG. 5
FIG. 6
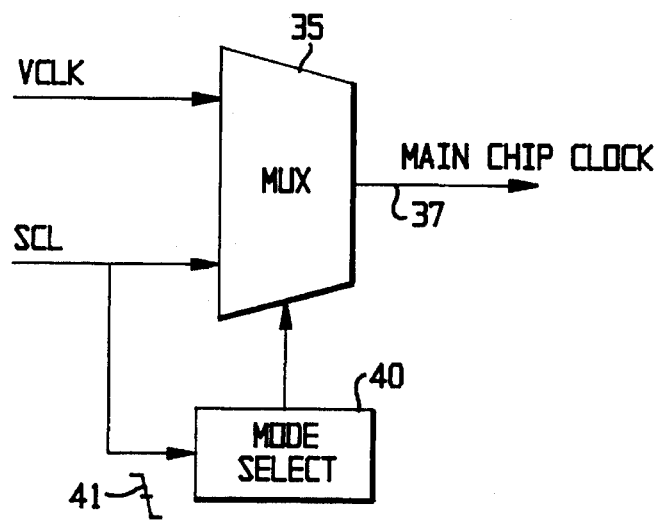

MEMORY DEVICE WITH SWITCHING OF DATA STREAM MODES

BACKGROUND OF THE INVENTION

The present invention relates generally to semiconductor memories, and more particularly to a serial electrically erasable programmable read only memory (EEPROM) for use in applications requiting storage and serial transmission of configuration and control information.

There is often a need to configure and reconfigure an intelligent peripheral device such as a monitor or a scanner to operate in different modes which are selected according to the needs of the apparatus with which the peripheral is operated. Since the advent of personal computers (PCs), for example, means have been available by which to run a program utilizing the PC monitor to provide a desired display mode. The monitor could be commanded to operate in one particular mode of the plural modes available for operation. Upon receipt of such a command, the video controller card responded by switching to the designated display mode, and the monitor automatically assumed that mode. Although no communication path existed by which the mode would be switched, the PC recognized that the video controller card had changed the scan rate, and responded with the mode switch. The monitor change was accompanied by an audible click attributable to relays changing the display mode.

It would be desirable to accommodate any of a plurality of possible modes by configuring an intelligent peripheral device automatically, without need for anything other than a recognition of the mode of a related device, and, indeed, by simply responding at the time of power-on of the peripheral device.

In 1993, the Video Electronics Standards Association (VESA) announced a proposed standard which defines a communication channel between a computer display and a host system for carrying configuration information to optimize use of the display as well as to carry additional display control information. This so-called display data channel would allow the display to inform the host system about its identity, and, depending on which of two types of the channel was used, viz., a uni-directional type and a bi-directional type, would allow the display to communicate additional levels of display capabilities.

It was deemed that this scheme represented a departure from earlier monitor identification (ID) schemes which only allowed for ID of a limited number of displays and display parameters, and carded no information about capabilities of the display. Consequently, it was felt that such earlier schemes had little use when connecting a new display to an existing host. An important objective of the VESA-proposed data display channel was to provide information for automatic configuration of a display controller based on the capabilities of the display.

Of the two data channel types, the uni-directional type is to provide a data channel from the display to the host to continuously transmit an ID data structure containing display identity and basic display specifications information. The other, a bi-directional type is based on the inter integrated circuit ($I^2C$, which is a trademark of N.V. Philips Corporation of the Netherlands) protocol. In the latter type, the host may request extended data ID or a data structure containing full display specifications.

In U.S. Pat. No. 5,276,458 to Sawdon, assigned to International Business Machines (IBM) Corp., a VESA member, a computer system has a display device for displaying visual information, and a display adapter for processing the information to be displayed on the display device. The display adapter includes a device driver that responds to a program instruction to transmit a command bit stream to the display device. A decoder decodes a response bit stream transmitted from the display device upon receipt of the command bit stream, to generate data and control signals compatible with a display mode of the display device.

It would desirable to have the availability of a stand-alone memory device with the capability to provide automatic switching of data stream transmission modes for a multiplicity of applications involving intelligent peripheral devices and a host computer or other data processor.

It is a principal object of the present invention to provide such a stand-alone memory device.

It would also be desirable to provide such a memory which is $I^2C$ bus-compatible for two wire serial interface bus operation. The $I^2C$ bus developed by Philips takes advantage of the similarity between designs of systems component devices from different sources, to allow communication and control functions between circuit chips, or ICs, constituting the different component devices. In essence, an $I^2C$ bus-compatible (or simply, $I^2C$-compatible) device incorporates an on-chip interface for communication directly with other such devices by means of an $I^2C$ bus, to avoid interfacing problems between chips of otherwise unrelated or only slightly related designs.

The $I^2C$ bus has two bus lines, one being a serial data (or SDA) line, and the other a serial clock (or SCL) line. Devices connected to the bus are software addressable and have master/slave relationships with other $I^2C$ compatible devices connected to the bus. The bus employs features such as collision detection and arbitration to prevent data corruption when two or more masters are vying for bus access, and allows serial, 8-bit oriented bi-directional data transfers at moderate speeds. The features and capabilities of the $I^2C$ bus are such that system designers are able to bring their designs rapidly to prototype stage, and to implement modifications as desired, by the technique of clipping or unclipping $I^2C$-compatible chips vis-a-vis the bus.

Accordingly, a memory device which is capable of automatic switching of data stream transmission modes for a multiplicity of intelligent peripheral applications, and which is also $I^2C$-compatible, is a powerful device for the systems designer, and for actual systems use.

It is therefore another important object of the present invention to provide a memory device having the capability of automatic switching of data stream transmission modes, as well as $I^2C$ compatibility.

SUMMARY OF THE INVENTION

The present invention comprises a serial EEPROM memory device which is $I^2C$-compatible for operation with a two wire serial interface bus, and having a plurality of data stream transmission modes. It is particularly useful in applications requiring storage and serial transmission of configuration and control information relative to an intelligent peripheral of a computer or other data processing system. Preferably, the memory is fabricated according to complementary metal-oxide-silicon (CMOS) technology.

In its presently preferred embodiment, the memory device has two modes of operation in which it implements a data channel or $I^2C$ bus interface with identification of the related intelligent peripheral. Upon power-up of the system, the EEPROM automatically assumes a transmit-only mode in which it transmits a serial bit stream of the entire memory array contents, which is clocked by a serial clock. The device remains in this transmit-only mode for so long as the voltage level on a predetermined serial clock pin of the device is held high. If, however, that pin undergoes a valid high to low transition, the memory reverts to its other mode, which is bi-directional and defines a byte selectable read/write capability of the memory array. Once the memory enters the bi-directional mode, it can be switched back to the transmit-only mode only by removing power from the device.

The transmit-only mode of the device supports a unidirectional two wire ($I^2C$) protocol for transmission of the contents of the memory army. Valid data is sent only after device initialization, with transmission on an SDA line pin of the device in 8 bit bytes sequentially from the memory array until the last byte is transmitted, with clocking by a serial clock VCLK. At that point, the output wraps around to the first location and continues.

The bi-directional mode of the device supports a two wire bi-directional data bus transmission ($I^2C$) protocol, in which a device that sends data on the bus is defined as the transmitter, and a device that receives data from the bus is defined as the receiver. In this mode, the EEPROM device of the invention acts as a slave, and the bus is controlled by a master device that generates the hi-directional mode serial clock (SCL), controls access to the bus, and generates start and stop conditions for data transfer. Both master and slave may operate as transmitter or receiver, but the master determines which mode is activated and controls access to the bus.

In the bi-directional mode bus protocol, data transfer may be initiated only when the bus is not busy. The "not busy" status of the bus is defined when both the data (SDA, which is a serial address/data I/O line) and clock (SCL) lines remain high. During data transfer, the SDA line is to remain stable when the SCL line is high, because changes in the SDA line while the SCL line is high are interpreted as a start or a stop condition.

Thus, the memory device automatically transmits configuration information and control information for the peripheral, represented by the stored data, on power-up of the device, and undergoes mode switching as a specified one of the clock lines transitions between high and low voltage levels. Two serial clock lines/inputs are provided, one for each mode.

According to the invention, however, only one main serial clock source is provided for the chip, with multiplexing of one or the other but not both of the serial clock lines, depending upon the data transmission mode, to accommodate the two modes of the device. This tends to assure that all data transmissions from the memory device are synchronized to the same source. Furthermore, since only one mode is operative at any given time, there is no competition between the two modes for the clock, nor any interference between the two that might corrupt the data transmissions on the SDA line when either mode was operative.

In the transmit-only mode, a multiplexer directs the VCLK input to the EEPROM device (i.e., the clock frequency, e.g., 60 Hertz, on the VCLK pin) to act as the main clock of the chip in which the device is fabricated. Subsequently, when the SCL clock line/input to the device undergoes an externally (to the device chip) induced transition in voltage levels that results in a switch from the transmit-only mode to the bi-directional mode, the multiplexer directs a clock signal on the SCL pin as the input to provide the single main clock of the chip. And when the power is removed from the device and later restored (on power-up), the device reverts to the transmit-only mode as the default mode, and the multiplexer again directs the clock signal on the VCLK line to become the main clock.

The multiplexer is controlled by a mode select switch that switches the multiplexer from the transmit-only (VCLK) mode on power-up of the chip, and thus from the VCLK pin to the SCL pin for the bi-directional mode, when the predetermined logic level transition takes place on the SCL line.

Therefore, another object of the invention is to provide a low voltage, nonvolatile programmable data memory which is electrically erasable in-system, and which selectively switches to any of a plurality of modes by which data is transmitted serially on a communication bus to adapt to the transmission mode of a host device for imparting information to the host regarding the configuration (and permitting possible reconfiguration) and control of a related intelligent peripheral device.

The memory device of the present invention is useful for supplying data in any of a plurality of different transmission modes, the methodology being suitable in many applications involving intelligent peripherals. A single internal main clock provokes a continuous supply of stored data from the memory device in each mode, with the other end of the communication channel capable of provoking the device to initiate mode switching, which results in a redirection of clock signal on the appropriate clock line as the main clock for the new mode.

BRIEF DESCRIPTION OF THE DRAWINGS

The above and still further objects, features, aspect and attendant advantages of the invention will become apparent from a consideration of the following detailed description of the presently contemplated best mode of carrying out the invention, taken in conjunction with the accompanying drawings in which:

FIG. 5 is a graph illustrating the data transfer sequence on the serial bus; and FIG. 6 is a block diagram of a multiplexer and associated control circuit used in the device of FIG. 1 to maintain operation selectively in either mode with full internal synchronization, effectively using only one main clock source.

DETAILED DESCRIPTION OF THE PREFERRED EMBODIMENT AND METHOD

Figure 1:
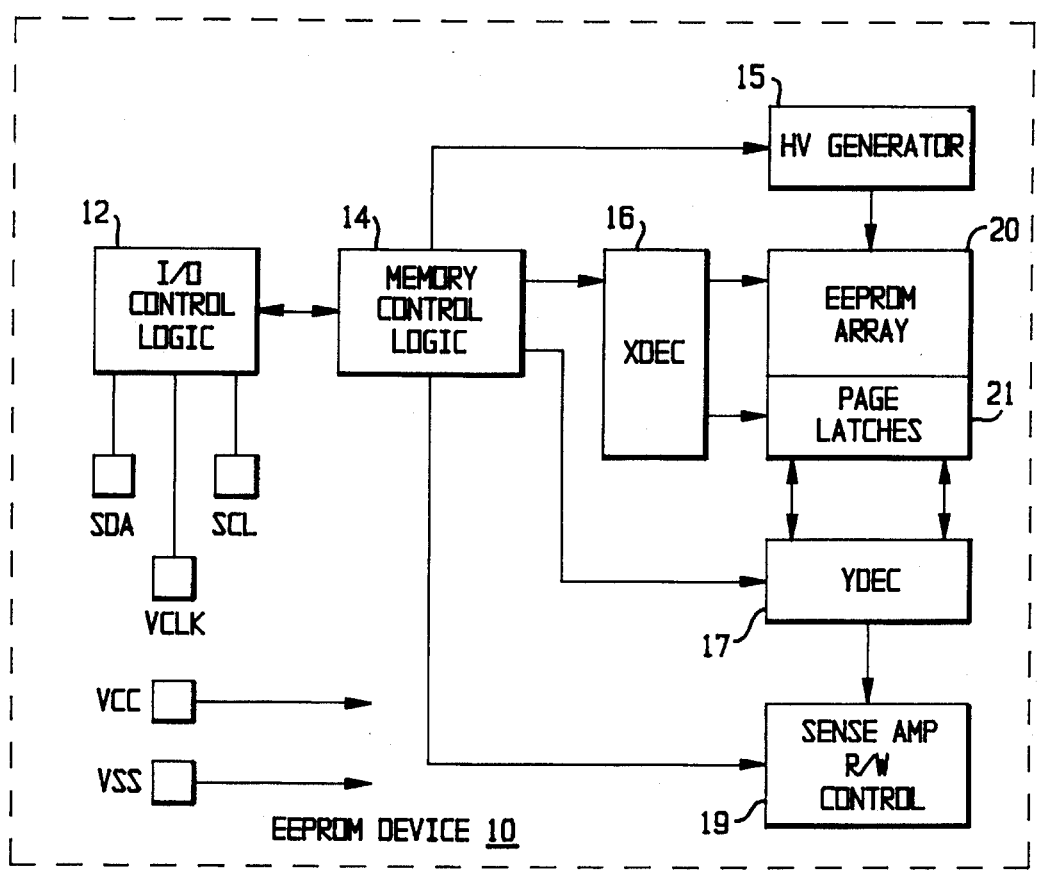
FIG. 1 is a simplified block diagram of a single chip EEPROM memory device embodying the invention.

In the exemplary embodiment of the invention illustrated in the block diagram of FIG. 1, the device is implemented as a 1K (128×8) bit serial EEPROM 10 with $I^2C$ compatibility. EEPROM 10 has a data line pin SDA, for serial address/data coupled to an input/output (I/O)) control logic 12, a serial clock line pin SCL also coupled to the I/O control logic, and another serial clock pin VCLK similarly coupled to the I/O control logic. The VCLK pin is for the transmit-only mode, and the SCL pin is for the bi-directional mode, of the EEPROM device. The input voltage level on each of these pins may be high or low, with resulting operation described below.

Pins VCC and VSS provide electrical power supply (battery, e.g., +2.5 V to 5.5 V) and ground, respectively, relative to the battery VDD (not shown).

I/O control logic 12 communicates with a memory control logic 14 which supplies inputs to an HV (high voltage) generator 15, an XDEC (X-line decoder) 16 and a YDEC (Y-line decoder) 17. Control logic 14 communicates bi-directionally with a sense amplifier R/W (read/write) control 19. XDEC 16 and YDEC 17 control the EEPROM array 20 with page latches 21. YDEC 17 also communicates with sense AMP R/W control 19.

Preferably, EEPROM device 10 is fabricated using CMOS process technology, for low power, nonvolatile memory applications. The device may be packaged, for example, in an 8 pin (three pins not used) PDIP (plastic dual in-line package) or SOIC (small outline integrated circuit) package.

The device is particularly implemented for use in applications requiring storage and serial transmission of configuration and control information, with selective operation in each of two modes—transmit-only and bi-directional. Separate two wire protocols support the two modes, each with a separate clock input as pointed out above, and sharing the common SDA data line. Upon power-up, the device automatically enters (i.e., defaults to) the transmit-only mode, in which it transmits a serial data bit stream of the entire EEPROM array 20 contents on the SDA pin, clocked by the clock signal on the VCLK. During this time the SCL pin is held high (i.e, at a logic high level).

The separate clock lines VCLK and SCL for transmit-only mode and bi-directional mode, respectively, are also utilized to effect switching between the two modes, as desired. To that end, once the device enters the transmit-only mode it remains in that mode for so long as the SCL pin is held high. Switching of the device from the transmit-only mode to the bi-directional mode is effected by an externally induced high level to low level voltage transition on the SCL input pin. This SCL line transition is recognized by the device to cause it to switch automatically to the bi-directional mode, with byte-selectable read/write capability of the EEPROM array. When the device is in the bi-directional mode, it may be switched back to the transmit-only mode only by removing power from the device.

Figure 2:
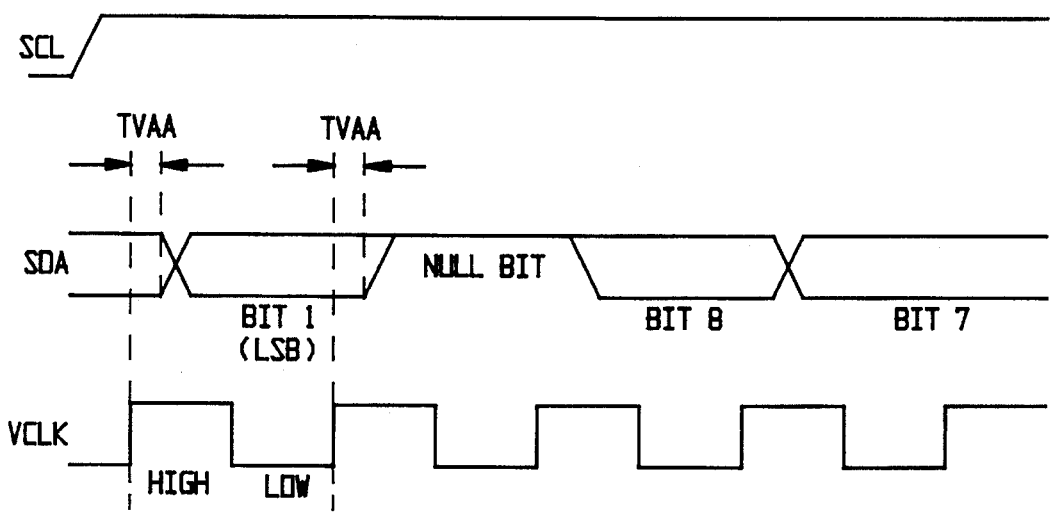
FIG. 2 is a graph illustrating the status of the data and clock pins/lines of the memory device of FIG. 1 in the transmit-only mode.

The transmit-only mode of the device supports a unidirectional two wire protocol for transmission of the contents of the memory army. Valid data is sent only after device initialization (described below), with transmission on the SDA pin (line) in 8-bit bit bytes, followed by a ninth bit—a null bit—as illustrated in the graph of FIG. 2, showing the voltage levels on (i.e., state or status of) pins VCLK, SDA, and SCL relative to time. The clock source for this mode is provided on the VCLK pin, with a data bit being output on the rising edge of each clock pulse. The parameter TVAA represents an elapsed time interval for validation of the input signal to the chip on the VCLK line, between the rising edge (e.g., 25) of the VCLK pin and the output of the data bit (e.g., bit 1) on the SDA line.

The eight bits in each byte of data are transmitted on the SDA line in the sequence of most significant bit first. Each byte within the EEPROM army 20 is output in sequence. When the last byte in the array is transmitted, the output wraps around to the first location and continues. The SCL pin is held high (e.g., at 27) to maintain the EEPROM device in the transmit-only mode.

Figure 3:
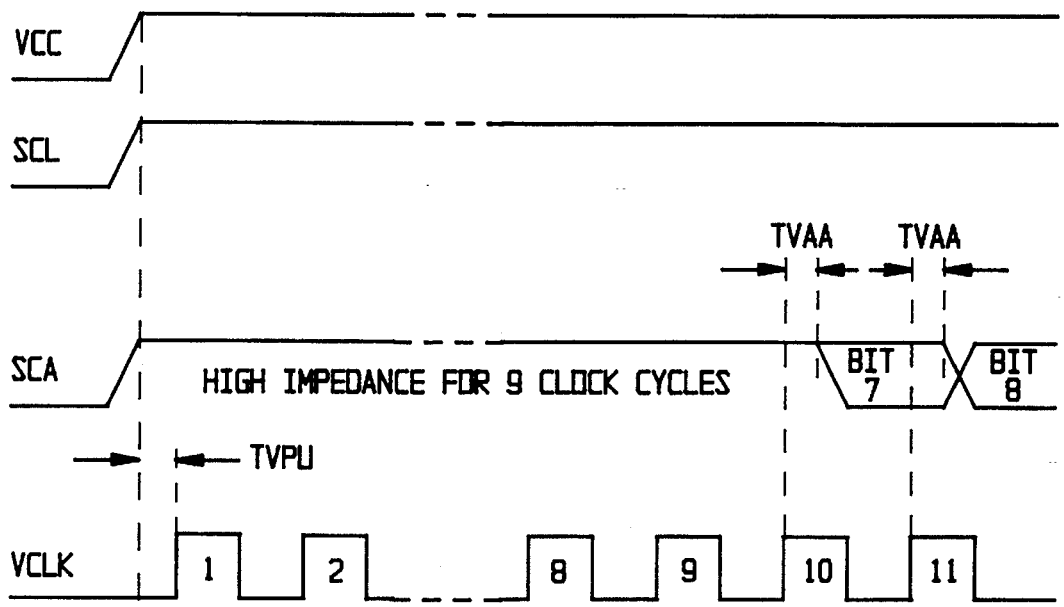
FIG. 3 is a graph which shows the procedure for device initialization.

An exemplary initialization procedure of the device is illustrated in the graph of FIG. 3. After the power supply VCC has stabilized, the device enters the transmit-only mode. Several clock cycles (nine in this particular example) on the VCLK pin must be given to the device for performance of internal synchronization. As previously noted and as will be explained in greater detail below, because the device effectively employs only one main chip clock accommodate any of the serial data transmission modes, it is only necessary to perform internal synchronization once during device operation, and that is done during the power-up interval. This represents a significant contribution to device speed and to smooth transition from one mode to another.

During the nine clock cycle period of internal synchronization, the SDA pin is in a high impedance state. On the rising edge of the tenth clock cycle, the memory device outputs the first valid data bit, which is the most significant bit of a byte from the EEPROM array 20. Power-up takes place at an indeterminate byte address, and the interval TVPU (illustrated on the VCLK line) between the commencement of the high impedance state of the SDA pin and the first clock cycle constitutes the power-up time for the transmit-only mode. After that, but before the first data bit is output from the array, the device proceeds through its internal synchronization.

Figure 4:
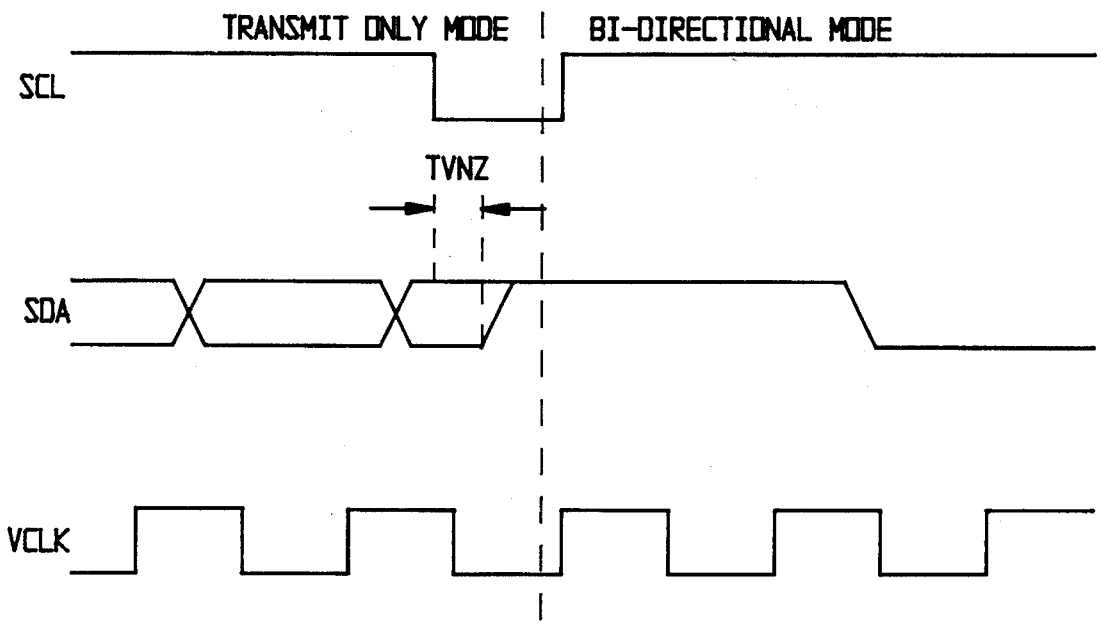
FIG. 4 is a graph illustrating switching of the memory device of FIG. 1 from the transmit-only mode to the bi-directional mode.

Referring now to the graph of FIG. 4, the device is switched from the transmit-only mode to the bi-directional mode by applying a valid high to low transition on the SCL clock pin. After the switch to the bi-directional mode, the VCLK input to the device is disregarded except that a logic high level on that pin enables a capability of an external device with bus access to write to the EEPROM.

The bi-directional mode of the device supports a two wire bi-directional data bus transmission protocol, in which a device that sends data on the bus is defined as the transmitter, and a device that receives data from the bus is defined as the receiver. In this mode the EEPROM memory device 10 acts as the slave, and the bus is controlled by a master device that generates the SCL logic levels and bi-directional mode clock, controls access to the bus, and generates start and stop conditions for data transfer. Both master and slave may operate as transmitter or receiver, but the master determines which mode is activated and controls access to the bus.

The bi-directional mode bus protocol allows data transfer to be initiated only when the bus is not busy (the "not busy" status of the bus being defined when both the data and the clock lines remain high), and during data transfer the data line (SDA) must remain stable whenever the clock (SCL) line is high. Changes in the SDA line while the SCL pin is high are interpreted as a start or a stop condition.

Referring now to FIG. 5, in part (A) the bus is not busy as both the SDA and SCL lines remain high. A start data transfer condition is presented in part (B), where a start condition (which must precede all commands) is determined by the existence of a high to low transition of the SDA line while the SCL clock line is high. A stop data transfer condition is presented in part (C), where a stop condition (which must occur in order to end all operations) is determined by the existence of a low to high transition of the SDA line while the SCL clock line is high.

A valid data situation is shown in part (D) of FIG. 5. The state of the SDA line represents valid data when, after a start condition, the SDA line is stable for the duration of the high period of the SCL clock signal. The data on the SDA line is allowed to change only during the low period of the SCL clock signal. One clock pulse is present per bit of data. Each data transfer is initiated with a start condition and terminated with a stop condition. The number of data bytes transmitted between start and stop conditions is determined by the master device and is theoretically unlimited. In the case of a write operation, where data is transmitted by the master device for storage in the EEPROM array during the bi-directional mode, only the last eight data bytes will be stored.

According to the invention, only one main clock source is provided for the chip, with selective multiplexing of one or the other of the serial clock lines, depending upon the desired data transmission mode, as the main clock to accommodate the two modes of the device. In this manner, all data transmissions from the memory device, regardless of mode, are essentially synchronized to the same source. Also, because the device can accommodate only one data mode at any given instant of time, competition between the two modes for the clock, and interference between them that might otherwise corrupt the data transmissions on the SDA line when either mode is operative, is nonexistent.

Initially, at start-up, the chip defaults to the transmit-only mode, and the multiplexing directs the VCLK input to the EEPROM device (i.e., the clock frequency, e.g., 60 Hertz, on the VCLK pin) to act as the main clock of the chip in which the device is fabricated. Subsequently, when the SCL clock line/input to the device undergoes a transition in voltage levels the multiplexed operation switches the chip from the transmit only mode to the bi-directional mode by supplying the clock signal input on the SCL pin to provide the single main clock of the chip. When the device is subsequently powered off and later powered up again, the VCLK clock is restored for the main clock.

To that end, and referring now to FIG. 6, a multiplexer (mux) 35 is fabricated in the EEPROM device 10 (the integrated circuit chip) to receive inputs from the SCL and VCLK pins. The output 37 of the multiplexer is applied as a single main clock of the chip. The multiplexer itself is controlled from a mode select block 40. When powered on, the device 10 automatically defaults to a preselected mode (FIGS. 2, 3)—the transmit-only mode in the embodiment which has been described herein. When a high to low transition occurs on the SCL pin (FIG. 4), the device reverts to another mode—the bi-directional mode, which is the only other data transmission mode in this embodiment—and cannot return to the first mode unless and until the EEPROM device is again powered on.

As described above, both VCLK and SCL are inputs to the respective correspondingly labeled pins of the chip (FIG. 1). A constant frequency is applied to the VCLK pin externally of the chip—from a video card (not shown), for example, in the case where the intelligent peripheral is a monitor (not shown)—and that clock signal essentially "runs" or drives the chip. For every rising edge of VCLK, the chip sends out a data bit from the EEPROM array on the SDA pin (FIG. 2). While this is occurring, the SCL pin is maintained at a constant logic high level. If the SCL pin is taken from that high level to a logic low level (FIG. 4), the VCLK clock signal will continue to be applied as an input to the chip on the VCLK pin, but the multiplexer 35 will have been switched to the SCL pin and thereby prevent the VCLK signal from going to any other point in the chip. Upon switching modes, the SCL line runs the main chip clock.

When the SCL pin goes from high to low, the chip ceases outputting data and briefly assumes a standby condition, from which point—until the chip is powered off—only clock pulses on the SCL pin will drive the chip output. From the instant of time at which the SCL line drives the main clock, the ongoing VCLK pin clock input signal (e.g., 60 Hz example) is ignored.

The mode select circuit 40 preferably consists essentially of an edge detector 41 which detects a high to low transition edge. If the edge detector encounters an SCL low level to high level transition, no mode switching will occur. But if the SCL later drops low, a high to low edge is detected and triggers mode switching by a signal from the mode select circuit to the multiplexer. In general, the I$^2$C SCL and SDA lines have pull-up resistors; if the SCL pin were to come up later than VDD (chip power), the edge detector would see a low to high transition on the SCL line—which it would ignore—and the EEPROM device would remain in the transmit-only mode.

As a consequence of this operation, a steady data stream is transmitted via the SDA line in one direction to a host device in the transmit-only mode, and in either direction in the bi-directional mode as controlled by the host. This includes configuration data for the intelligent peripheral device—monitor, scanner, or other—for example, the make of the peripheral, its model number, its capabilities, its serial number, secure information if applicable, and any other data that is stored in the EEPROM array.

Although the best mode presently contemplated for carrying out the invention has been described in terms of a presently preferred embodiment, it will be apparent to those skilled in the relevant field that variations and modifications may readily be implemented without departing from the true spirit and scope of the invention. Accordingly, it is intended that the invention should be limited only by the appended claims and the pertinent rules of applicable law.

What is claimed is:

1. An I$^2$C bus-compatible, serial, electrically erasable programmable read-only memory (EEPROM) device for storage and serial transmission of configuration information for an intelligent peripheral device with which the EEPROM device is to be associated, for communication of the information on a bus to a host device, comprising:

an EEPROM array for storing data representing the configuration and control information, and means for selectively establishing any of a plurality of modes supported by said EEPROM device for transmitting data stored in the EEPROM army sequentially onto the bus in the established mode to the exclusion of all other modes for allowing interaction between said host device and said peripheral device, including separate clock input lines to said EEPROM device each associated with a respective distinct and different one of said modes and a data line for outputting data from the EEPROM array onto the bus as clocked by the respective clock input line for the established mode, said means for selectively establishing including means for selectively multiplexing said separate clock input lines to the EEPROM device as a single clock source according to the mode to be established.

2. The EEPROM device of claim 1, wherein:

said means for selectively multiplexing includes a multiplexer and mode switching means for controlling the multiplexer to switch modes.

3. The EEPROM device of claim 2, wherein:

said mode switching means is responsive to a transitioning signal on one of said clock input lines for evoking control of the multiplexer.

4. The EEPROM device of claim 2, wherein:

said mode switching means is an edge detector for response to a logic level transition on said one clock input line to evoke control of the multiplexer.

5. The EEPROM device of claim 1, wherein:

said means for selectively establishing any of a plurality of modes is adapted to establish either of only two modes, one of which allows said EEPROM array to be read only to output data provoked by clock signal from said single clock source, and the other of which allows said EEPROM array to be read or written to, and said read only mode is a default mode of the EEPROM device.

6. A method of transmitting a stream of data representing configuration information for an intelligent peripheral device from a programmable data memory device associated with the peripheral device, for communication on a bus to a host device, comprising the memory device-implemented steps of:

receiving said data for storage in an array of said memory device, and selectively establishing any of a plurality of modes supported by said memory device for transmitting data stored in said array sequentially onto the bus in the established mode to the exclusion of all other modes for allowing interaction between said host device and said peripheral device, with separate clock input lines to the memory device associated with respective distinct and different modes and a data line for outputting data from the array onto the bus as clocked by the respective clock input line for the established mode, including selectively multiplexing said separate clock input lines to the memory device as a single clock source according to the mode to be established.

7. The method of claim 6, further including:

switching from one of said modes to another in response to a predetermined transitioning signal on one of the clock input lines.

8. The method of claim 7, further including:

recognizing said transitioning signal communicated on the bus from said host device.

9. The method of claim 7, further including:

detecting a prescribed edge of said transitioning signal as a command to switch modes.

10. The method of claim 6, including:

setting the initial mode of the memory device following start-up of the memory device, as a default mode of the memory device.

11. The method of claim 10, including:

selectively establishing only two modes of data transmission for the memory device, one of which allows the memory device to only transmit data stored in the array, and the other of which allows said memory device to both transmit data and receive and store new data in the array, and setting the transmit-only mode as the default mode of the memory device.

12. A memory device adapted to be programmed to store predetermined data in a memory army of the device for defining the configuration of an associated peripheral device to a host device coupled for communication with said memory device and adapted to control said peripheral device, the memory device comprising:

first means for storing said data, second means for delivering said data sequentially from storage to a bus for communication to said host device, third means for independently supplying clock pulses on any of a plurality of input clock lines to clock said data for transmission on said bus in any of a plurality of selectable modes associated with respective ones of said plurality of clock lines, fourth means for selectively switching from one of said modes to another of said modes by recognizing a transitioning logic level on a clock line other than the clock line being used to clock said data and fifth means for restricting the third means to a single clock source regardless of the mode selected for transmission of the data on said bus.

13. The memory device of claim 12, wherein:

said host device includes a personal computer and said peripheral device includes a monitor having a display.

14. The memory device of claim 12, wherein:

said single clock source is adapted for internal synchronization of said memory device.

15. The memory device of claim 12, wherein:

said fifth means includes a multiplexer controlled at least in part by said transitioning logic level to evoke a switch from an initial transmit-only default mode.

16. The memory device of claim 15, wherein:

said fifth means includes an edge detector for recognizing said transitioning logic level to control said multiplexer.

* * * * *